(12) United States Patent
Jaramillo et al.

(10) Patent No.: US 6,785,854 B1
(45) Date of Patent: Aug. 31, 2004

(54) TEST ACCESS PORT (TAP) CONTROLLER SYSTEM AND METHOD TO DEBUG INTERNAL INTERMEDIATE SCAN TEST FAULTS

(75) Inventors: Ken Jaramillo, Phoenix, AZ (US); Prasad Vajjhala, Campbell, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 672 days.

(21) Appl. No.: 09/678,412

(22) Filed: Oct. 2, 2000

(51) Int. Cl.[7] .............................................. G01R 31/28
(52) U.S. Cl. ...................... 714/729; 714/727
(58) Field of Search ...................... 324/158.1; 714/726, 714/727, 724, 729, 733

(56) References Cited

U.S. PATENT DOCUMENTS

| | | | |
|---|---|---|---|
| 5,396,170 A | * | 3/1995 | D'Souza et al. ......... 324/158.1 |
| 5,592,493 A | * | 1/1997 | Crouch et al. .............. 714/726 |
| 5,636,227 A | | 6/1997 | Segars |
| 5,774,475 A | | 6/1998 | Qureshi |
| 5,862,152 A | * | 1/1999 | Handly et al. ............... 714/727 |
| 5,898,701 A | | 4/1999 | Johnson |
| 6,122,762 A | * | 9/2000 | Kim ........................... 714/726 |
| 6,314,539 B1 | * | 11/2001 | Jacobson et al. ........... 714/727 |
| 6,584,590 B1 | * | 6/2003 | Bean ........................... 714/724 |

* cited by examiner

*Primary Examiner*—David Ton
(74) *Attorney, Agent, or Firm*—Michael J. Ure

(57) ABSTRACT

A system and method facilitates simplified debugging of internal component scan testing. In an example embodiment, a TAP controlled internal scan test intermediate debugging system includes an intermediate TAP controller internal scan test system, design circuit blocks, a scan test chain primary input pin, a scan test chain final output pin. The components of the intermediate TAP controlled internal scan test debugging system cooperatively operate to facilitate debugging of faults through extraction of intermediate scan test chain signals. The intermediate TAP controller internal scan test system transmits an indicated intermediate scan test chain signal off of the IC as a TAP test data out (TDO) signal. The intermediate TAP controller internal scan test system utilizes an internal scan observe register to store information indicating which intermediate internal scan test chain signal to forward as a TAP TDO signal.

20 Claims, 5 Drawing Sheets

TEST ACCESS PORT (TAP) CONTROLLER SYSTEM AND METHOD TO DEBUG INTERNAL INTERMEDIATE SCAN TEST FAULTS

FIELD OF THE INVENTION

The present invention relates to the field of electrical integrated circuit testing. More particularly, the present invention relates to a system and method that facilitates debugging of internal component scan test faults.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic systems designed to provide these results comprise a variety of components or devices including microelectronic integrated circuits. Usually the components or devices of an electronic system are required to operate properly in order for the desired results to be realized. An efficient and reliable integrated circuit (IC) testing system and method is very important for assuring an IC operates properly.

The complexity of commonly used integrated circuits included in system-on-chip (SOC) designs has advanced dramatically and built in self test (BIST) diagnostics capability is essential for effective circuit testing, debugging, and maintenance. Modem BIST techniques typically include the insertion of a scan test architecture in an IC. Scan testing of complex electronic systems and circuits often includes the application of test vectors to stimulate certain aspects of a circuit (e.g., a functional logic component) and observation of the resulting output from the circuit. Usually, scan test architectures include scan test components or devices (e.g., scan test cells) coupled together to form a scan test chain. The scan test elements communicate test vectors to components of an IC and interact with functional logic utilized to perform non-test or normal operations of the IC. Typically, scan test chains are designed to scan or shift scan test information (e.g., test vectors) to appropriate locations in a circuit, capture scan test information and then shift the scan test information off the IC.

Usually it is desirable to have significant scan test coverage, typically the greater the test coverage the greater the capacity of a scan test system and method to detect faults. Boundary scan testing is a very common method of scan testing included in typical BIST schemes. International Electrical and Electronic Engineering (IEEE) Standard 1149.1 (also referred to as Joint Task Action Group (JTAG)) boundary scan compliant architecture is one of the most prevalent boundary scan schemes. It is also very important to have internal scan test capabilities to provide greater scan test coverage. Having both internal and boundary scan capability often requires significant commitment of limited IC resources, such as increased dedication of scarce IC pins to scan test operations.

Debugging scan test results often requires complicated analysis of logic values retrieved from appropriately selected circuit nodes (e.g., at the outputs or inputs of functional logic) after the application of test vectors. Traditional long scan test vectors provided by automated test pattern generation (ATPG) tools make scan test debugging very difficult. Test patterns provided by an ATPG tool often appear to an engineer as random data shifted onto the chip. Usually the engineers do not have an in-depth understanding of each scan test pattern generated by ATPG tools. Common methods of attempting to solve scan test debug difficulties include forcing certain predetermined patterns into a scan test input and attempting to infer what is causing the problem based upon how a scan test output behaves or changes. However, without a good understanding of the test vector pattern it is usually difficult to accurately identify a fault.

Scan test patterns are typically very long (scan test chain lengths of thousands of scan elements are common) and it is inherently difficult to debug failures or fault indications. Analyzing the behavior of limited number of circuit elements in response to a test vector is relatively easy and making an inference identifying the element causing a fault problem is relatively accurate. However, each element added to a scan test chain results in another element that is a potential source of a fault. Accurately inferring which element is the source of the fault becomes increasingly more difficult the greater the number of scan test elements since there are more possible sources of causing the problem.

Traditional methods of attempting to solve scan test debug difficulties usually consume significant resources and often lack a high degree of reliability. For example, utilizing small scan test chains with shorter test vectors typically results in significantly increasing the requirement for dedication of scarce pin resources to scan test operations. While small scan test chains may offer some advantages, they do not offer the flexibility of testing large sections of a system and make it difficult to test the operations of an entire system since only a small portion is tested at any given time. Thus, attempts to identify sources of faults in traditional scan test operations is often inaccurate and unreliable.

What is required is a system and method that facilitates simplified debugging of internal component scan test results. The system and method should support efficient scan testing of integrated circuit components and accommodate utilization of existing scan testing architectures with minimal adverse redesign impacts to existing IC designs.

SUMMARY OF THE INVENTION

The present invention is a system and method that facilitates simplified debugging of internal component scan test results. The test access port (TAP) controlled internal scan test intermediate debugging system and method of the present invention is capable of supporting efficient scan testing of integrated circuit components with an ATPG tool while assisting debugging operations. The present invention system and method accommodates utilization of existing scan testing architectures with minimal adverse redesign impacts to existing IC designs, normal operations and manufacturing processes. The present invention enhances internal scan test analysis of digital circuits and is compatible with traditional scan test methodologies.

One embodiment of a present invention TAP controlled internal scan test intermediate debugging system comprises a intermediate TAP controller internal scan test system, design circuit blocks, a scan test chain primary input port (e.g., a pin), a scan test chain final output port. The components of the TAP controlled internal scan test intermediate debugging system cooperatively operate to facilitate debugging of faults through extraction of intermediate scan test chain signals via a TAP. The intermediate TAP controller internal scan test system controls transmission of an indicated intermediate scan test chain signal off of the IC as a TAP test data out (TDO) signal. The intermediate TAP controller internal scan test system comprises an internal scan observe register, a TAP output control circuit and a TAP output multiplexer (MUX). The information stored in the scan observe register indicates which intermediate internal scan test chain signal to forward as a TDO signal. The design circuit blocks perform designated functions during normal operation mode of the IC. During scan test operations scan test elements of the design circuit blocks shift in scan test vectors, capture resulting scan test information and shift out the scan test results. The scan test chain primary input port provides a communication port for scan test input information and the scan test chain final output port (e.g., a pin) provides a communication port for scan test output information.

By selectively transmitting intermediate internal scan test chain signals (ISS) off of the IC, manipulation of a scan test vector value by a relatively small number of design circuit blocks is isolated in an analytical sense from manipulations by other design circuit blocks. If an intermediate ISS is an unexpected value it provides an indication that a fault may exist in one or more of a relatively small number of design circuit blocks. Isolating the fault to a limited number of design circuit blocks facilitates debugging without having to consider the manipulation of test vector values by other design circuit blocks. The present invention also conveniently facilitates testing of a relatively large scan test chain by providing scan test results on the scan test chain final output pin at the same time. Thus, the present invention facilitates simplified debugging of internal scan test results by isolating scan test vector inputs to a design circuit block and an intermediate scan test signal output of the design circuit block.

DETAILED DESCRIPTION OF THE INVENTION

Reference will now be made in detail to the preferred embodiments of the invention, a TAP controlled internal scan test debugging intermediate system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

One embodiment of the present invention includes an intermediate test access port (TAP) controlled internal scan test system and method. In one embodiment of the present invention, an intermediate TAP controlled internal scan test system is coupled to a scan test chain and is compatible with normal scan testing methodologies. The intermediate TAP controlled internal scan test system components are included in a design at various locations during the initial stages of a manufacturing process in one embodiment of the present invention and coupled to intermediate scan test signals. In one exemplary implementation of the present invention, the intermediate TAP controlled internal scan test system is configured in a manner that is compatible with a scan test architecture familiar to an ATPG tool and easily accessible by the ATPG tool. The intermediate test access port (TAP) controlled internal scan test system and method of the present invention facilitates debugging of scan test fault indications by assisting analysis of intermediate sections of a scan test chain.

Figure 1:
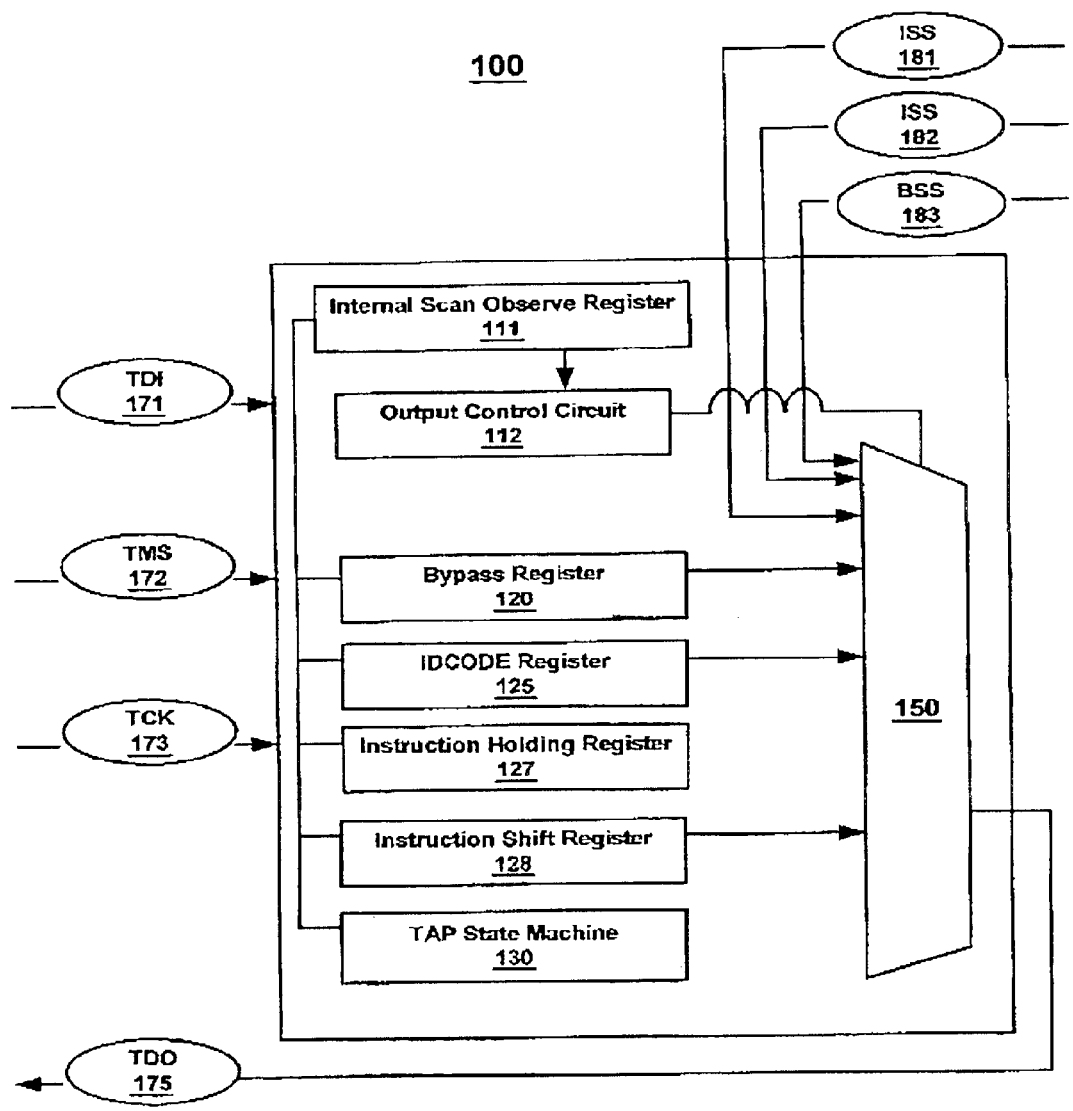
FIG. 1 is a block diagram of intermediate TAP controller internal scan test system, one embodiment of the present invention.

FIG. 1 is a block diagram of intermediate TAP controller internal scan test system 100, one embodiment of the present invention. TAP controller internal scan test system 100 comprises internal scan observe register 111, TAP output control circuit 112 and TAP output multiplexer (MUX) 150. In one embodiment of the present invention, TAP controller internal scan test system 100 also includes bypass register 120, IDcode register 125, instruction holding register 127, instruction shift register 128 and TAP state machine 130. Internal scan observe register 111 is coupled to output control circuit 112 which is coupled to TAP output MUX 150. TAP output MUX 150 is coupled to intermediate internal scan test chain signal (ISS) 181, intermediate internal scan test chain signal (ISS) 182, and boundary scan signal (BSS) 183. BSS 183 is the output signal from a chain of boundary scan test cells (not shown). Intermediate ISS 181 and 182 are intermediate scan test chain signals from intermediate points on an internal scan test chain (not shown). TAP state machine 130 is coupled to internal scan observe register 111, bypass register 120, IDcode register 125, instruction holding register 127 and instruction shift register 128. In one embodiment of the present invention, TAP output MUX 150 is also coupled to bypass register 120, IDcode register 125 and instruction shift register 128. TAP controller internal scan test system 100 is coupled to test data in (TDI) signal 171, test mode select (TMS) signal 172, scan test clock (TCK) signal 173 and test data out (TDO) signal 175. Test data in (TDI) signal 171, test mode select (TMS) signal 172, scan test clock (TCK) signal 173 and test data out (TDO) signal 175 are communicated on or off an IC via test access ports associated with intermediate TAP controller internal scan test system 100.

The components of intermediate TAP controller internal scan test system 100 cooperatively operate to provide control for both internal and boundary scan testing. Output control circuit 112 controls TAP output MUX 150. Intermediate TAP controller internal scan test system 100 is configured to react to an internal scan test mode indication instruction (e.g., SCANTESTMODE) that determines whether TAP output MUX 150 is utilized to forward internal scan test signals or it is utilized to forward boundary scan test signals. Internal scan observe register 111 is an additional TAP controller data register that provides internal scan test directions to the output control circuit 112 when the TAP controller internal scan test system 100 is operating in internal scan test mode. Output control circuit 112 provides a control signal that controls the output of TAP output MUX 150. TAP output MUX 150 outputs one of its input signals (e.g., ISS 181, 182 or BSS 183) as TDO signal 175 based upon the control signal from output control circuit 112.

Transmission of intermediate internal scan test chain signals off an IC by intermediate TAP controller internal scan test system 100 facilitates debugging of faults. In one embodiment of the present invention, a plurality of intermediate internal scan test chain signals (e.g., intermediate ISS 181 and 182) provide information on scan test results (e.g., measurements of logical values) from intermediate scan test chain nodes in a scan test chain. Intermediate TAP controller internal scan test system 100 selectively transmits one of the intermediate internal scan test chain signals off of the IC at a time. By selectively transmitting one of the intermediate scan test chain signals off of the IC, intermediate TAP controller internal scan test system 100 facilitates finer granularity of test results. Intermediate TAP controller internal scan test system 100 assists scan test analysis, including debugging fault locations based upon scan test results from intermediate scan test chain locations. Scan test results from intermediate locations effectively reduce the number of components (e.g., a design circuit block) that are locations of a potential fault in a portion of the scan test chain while still permitting a scan test result for the entire chain via a scan test chain final output port (not shown).

Figure 2:
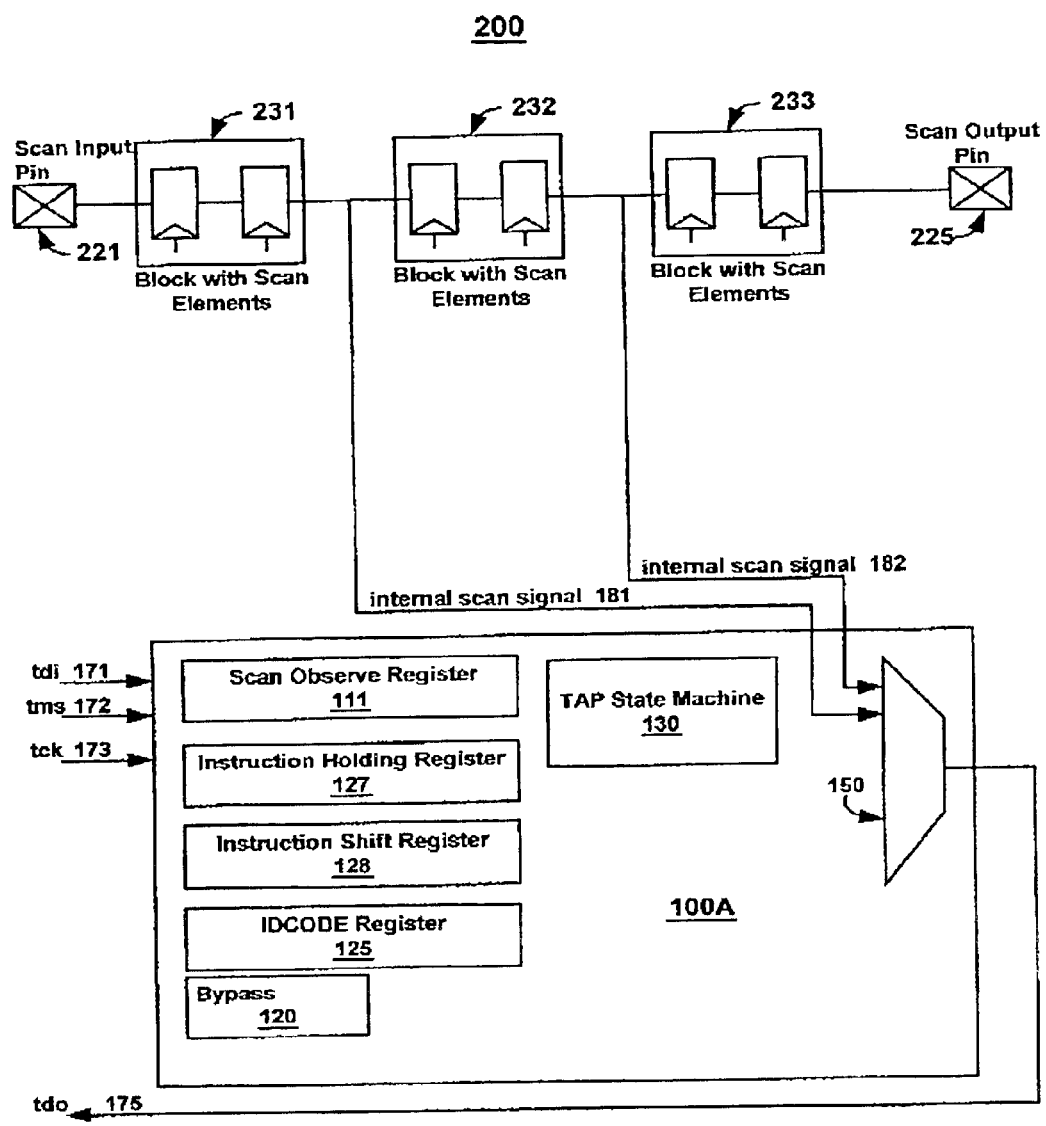
FIG. 2 is a block diagram of one embodiment of a TAP controlled internal scan test debugging system of the present invention.

FIG. 2 is a block diagram of TAP controlled internal scan test intermediate debugging system 200, one embodiment of the present invention. TAP controlled internal scan test intermediate debugging system 200 includes intermediate TAP controller internal scan test system 100, design circuit blocks 231 through 233, scan test chain primary input port 221, and internal scan test chain final output port 225. Design circuit blocks 231 through 233 include scan test elements. In one exemplary implementation of the present invention, a scan test chain primary input port 221 and internal scan test chain final output port 225 are dedicated internal scan test pins and in another example implementation they are utilized as functional input and output pins during normal operations and scan test input and output pins during scan test operations. Intermediate TAP controller internal scan test system 100 is coupled to design circuit blocks 231 through 233. Design circuit block 231 is coupled to scan test chain primary input port 221 and design circuit block 232. Design circuit block 233 is coupled to internal scan test chain final output port 225 and design circuit block 232.

The components of TAP controlled internal scan test debugging system 200 cooperatively operate to provide functional operations and facilitate debugging of faults through transmission of intermediate scan test chain signals off of the IC. Intermediate TAP controller internal scan test system 100 transmits an indicated intermediate scan test chain signal off of the IC as TDO signal 175 via a test data out (TDO) port associated with intermediate TAP controller internal scan test system 100. The information in scan observe register 111 indicates which intermediate internal scan test chain signal (e.g., intermediate ISS 181 or 182) to forward as TDO signal 175. Design circuit blocks 231 through 233 perform designated functions during normal operation mode of the IC. During scan test operations the scan test elements of design circuit blocks 231 through 233 shift in scan test vectors, capture resulting scan test information and shift out the scan test results. Scan test chain primary input port 221 provides a communication port for scan test input information at the beginning of a scan test chain. Scan test chain final output port 225 provides a communication port for scan test output information at the end of a scan test chain.

TAP controlled internal scan test intermediate debugging system 200 facilitates greater granularity of test vector results and assists scan test analysis including debugging indications of faults. By selectively transmitting intermediate ISS 181 off of the IC, manipulation by design circuit block 231 of a scan test vector value input on internal scan test input port 221 is isolated in an analytical sense from manipulations of the test vector value by design circuit blocks 232 and 233. If intermediate ISS 181 is an unexpected value it provides an indication that a fault may exist in design circuit block 231. Isolating the fault to design circuit block 231 facilitates debugging without having to consider the manipulation of test vector values by design circuit blocks 232 and 233. Similarly, manipulations by design circuit block 232 on a scan test vector value are isolated from manipulations by circuit block 233 by transmitting test vector values output from design circuit block 232 as ISS 182. Test vector value output from design circuit block 232 is transmitted by TAP output MUX 150 off an IC as TDO signal 175. Thus, the present invention facilitates simplified debugging of internal scan test results by isolating an intermediate scan test signal output of a design circuit block.

Figure 3:
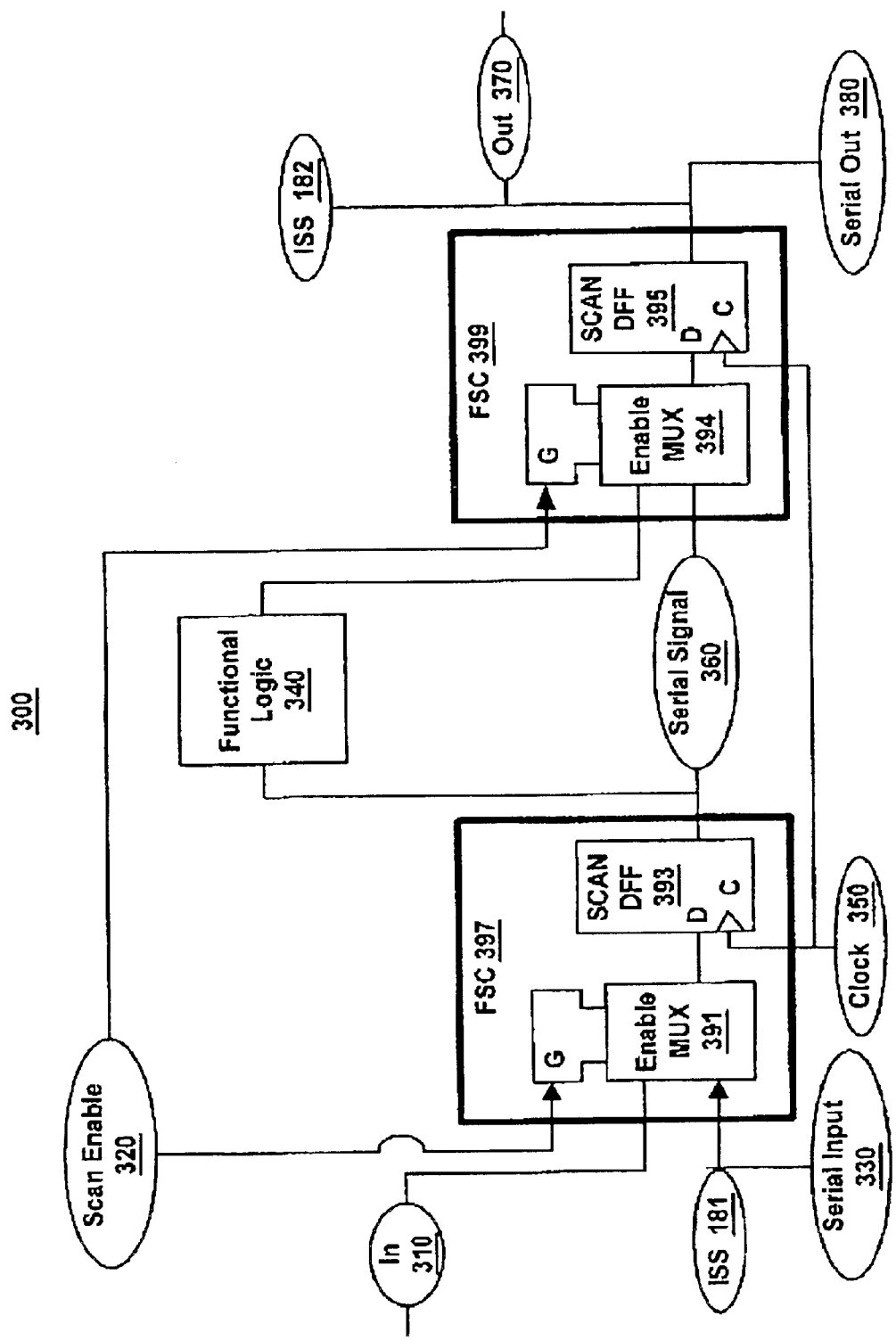
FIG. 3 is a block diagram of full scan cell, one embodiment of a design block included in an implementation of the present invention.

FIG. 3 is a block diagram of design block 300, one embodiment of a design block (e.g., design block 232) included in one implementation of the present invention. Design block 300 comprises full scan cell (FSC) 397, FSC 399 and functional circuit 340. The output of FSC 397 is coupled to functional circuit 340 which is coupled to the input of FSC 399. Full scan cell 397 comprises enable MUX 391 and scan D flip flop (FF) 393. Enable MUX 391 is coupled to normal data in signal 310, intermediate scan test signal 181, scan serial input signal 330, scan enable signal 320, and scan DFF 393. Scan DFF 393 is also coupled to clock signal 350, scan serial signal 360 and FSC 399. Full scan cell 399 comprises enable MUX 394 and scan D flip flop (DFF) 395. Enable MUX 394 is coupled to functional circuit 340, scan serial signal 360, scan enable signal 320, and scan DFF 395. Scan DFF 395 is also coupled to clock signal 350, normal data out signal 370, intermediate scan test signal 182, and scan serial output signal 380.

Design block 300 facilitates testing of functional circuit 340 during scan test operations. Enable MUX 391 selects normal data in signal 310 or serial data input signal 330 for transmission to scan DFF 393 depending upon the logical state of scan enable signal 320. When scan enable signal 320 is active, data is serially shifted into and out of DFF 393 and 394. Scan DFF 393 latches the signal from enable MUX 391 and transmits the signal to functional circuit 340 and as scan serial signal 360 to DFF 394 based upon cycles in clock signal 350. Thus, data is provided to functional circuit 340 via DFF 393 from normal data in signal 310 if scan enable signal 320 is not active or serial input signal 330 if scan enable signal 320 is active. To capture the output of functional circuit 340 after it has acted upon the desired test data, scan enable signal 320 is deasserted. By deasserting scan enable signal 320, MUX 394 does not forward the serial signal 360 from scan DFF 395, instead MUX 394 forwards the output of functional circuit 340 to scan DFF 395. After the output of functional circuit 340 is transferred to scan DFF 395 it is output either as normal output 370 signal through a normal operation output pins or serial output signal 380 via other FSCs (e.g., FSCs included in design block 273) or as intermediate scan test signal 182.

Figure 4:
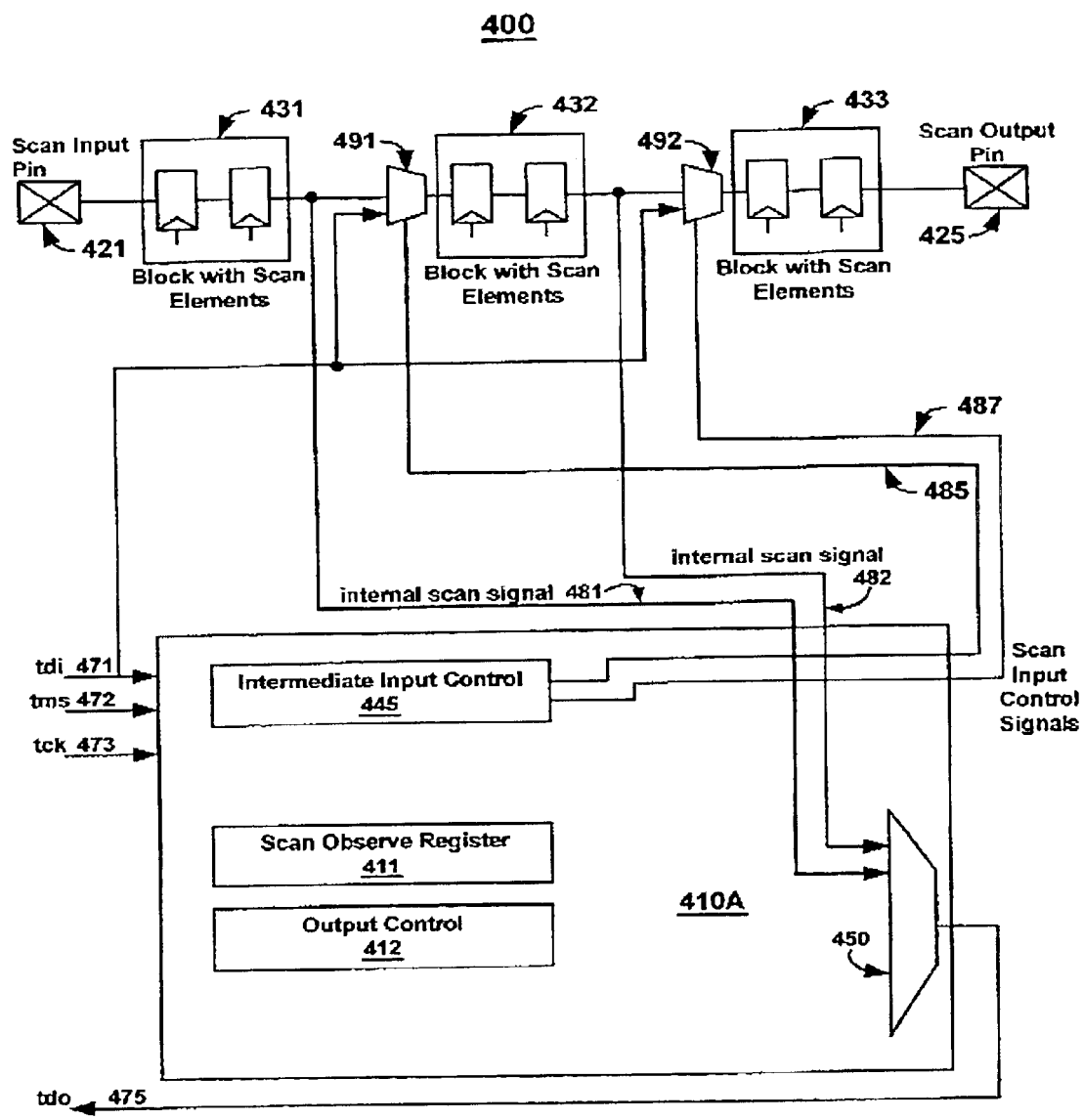
FIG. 4 is a block diagram of TAP controlled internal scan test debugging system with intermediate internal scan test input signals control, one embodiment of the present invention.

FIG. 4 is a block diagram of TAP controlled internal scan test debugging system 400, one embodiment of the present invention. TAP controlled internal scan test debugging system 400 is similar to TAP controlled internal scan test debugging system 200 except TAP controlled internal scan test debugging system 400 also controls intermediate internal scan test input signals. TAP controlled internal scan test debugging system 400 includes intermediate TAP controller internal scan test system 410, intermediate internal scan test input signal multiplexer (MUX) 491, intermediate internal scan test input signal multiplexer (MUX) 492, design circuit blocks 431 through 433, scan test chain primary input port 421, and scan test chain final output port 425. Design circuit blocks 431 through 433 include scan test elements. Intermediate TAP controller internal scan test system 410 is coupled to design circuit blocks 431 through 433, intermediate internal scan test input signal MUX 491, and intermediate internal scan test input signal MUX 492. Design circuit block 431 is coupled to scan test chain primary input port 421 and intermediate internal scan test input signal MUX 491 which is coupled to design circuit block 432. Design circuit block 433 is coupled to scan test chain final output port 425 and intermediate internal scan test input signal MUX 492 which is coupled to design circuit block 432.

Intermediate TAP controller internal scan test system 410 is similar to intermediate TAP controller internal scan test system 100 except intermediate TAP controller internal scan test system 410 also has the ability to control intermediate scan test input signals. Intermediate TAP controller internal scan test system 410 comprises internal scan observe register 411, TAP output control circuit 412, intermediate input control register 445 and TAP output multiplexer (MUX) 450. In one embodiment of the present invention, TAP controller internal scan test system 410 includes a bypass register, IDcode register, instruction holding register, instruction shift register and TAP state machine similar to intermediate TAP controller internal scan test system 100. Internal scan observe register 411 is coupled to output control circuit 412 which is coupled to TAP output MUX 450. TAP output MUX 450 is coupled to intermediate internal scan test chain signal (ISS) 481, intermediate internal scan test chain signal (ISS) 482, and a boundary scan test signal (not shown). The boundary scan test signal is the output signal from a chain of boundary scan test cells (not shown). TAP controller internal scan test system 410 is coupled to test data in (TDI) signal 471, test mode select (TMS) signal 472, scan test clock (TCK) 473 and test data out (TDO) signal 475. Test data in (TDI) signal 471, test mode select (TMS) signal 472, scan test clock (TCK) 473 and test data out (TDO) signal 475 are communicated on or off an IC via test access ports (e.g., pins) associated with intermediate TAP controller internal scan test system 410.

An intermediate internal scan test input MUX (e.g., 491 or 492) selectively forwards a test data in (TDI) signal or an internal scan test signal to a design circuit block based upon an intermediate input control signal from TAP controller internal scan test system 410. In one embodiment of the present invention, intermediate input control register 445 is coupled to intermediate input control signals 485 and 487 which control intermediate internal scan test input MUX 491 and intermediate internal scan test input MUX 492 respectively. In another embodiment of the present invention, internal scan observe register 411 also functions as the intermediate input control register and is coupled to intermediate input control signals 485 and 487 and controls the selection of an intermediate internal scan test input signal by intermediate internal scan test input MUX 491 and intermediate internal scan test input MUX 492 respectively.

In one exemplary implementation of the present invention, the TDI signal selected by a intermediate internal scan test input MUX is communicated from a test access port (e.g., a pin) associated with TAP controller internal scan test system 410. By selectively forwarding the TDI signal to the input of a design circuit block, TAP controlled internal scan test debugging system facilitates simplified analysis of faults. For example, intermediate internal scan test input MUX 491 selectively forwards TDI signal 471 or intermediate internal scan test chain signal 481 as an intermediate input signal to design circuit block 432 based upon intermediate input control signal 485 from TAP controller internal scan test system 410. When TDI signal 471 is transmitted to design circuit block 432 the logical value of the input to the design circuit block is isolated from manipulations by design circuit block 431. Thus, the number of scan test elements that are locations of a potential fault in a portion of the scan test chain are limited. Controlling the intermediate scan test chain input signals and selecting an intermediate internal scan test chain signal for transmission off of an IC facilitates isolation and analysis of a scan test fault while still permitting a scan test result for the entire chain via a scan test chain final output pin (not shown).

Figure 5:
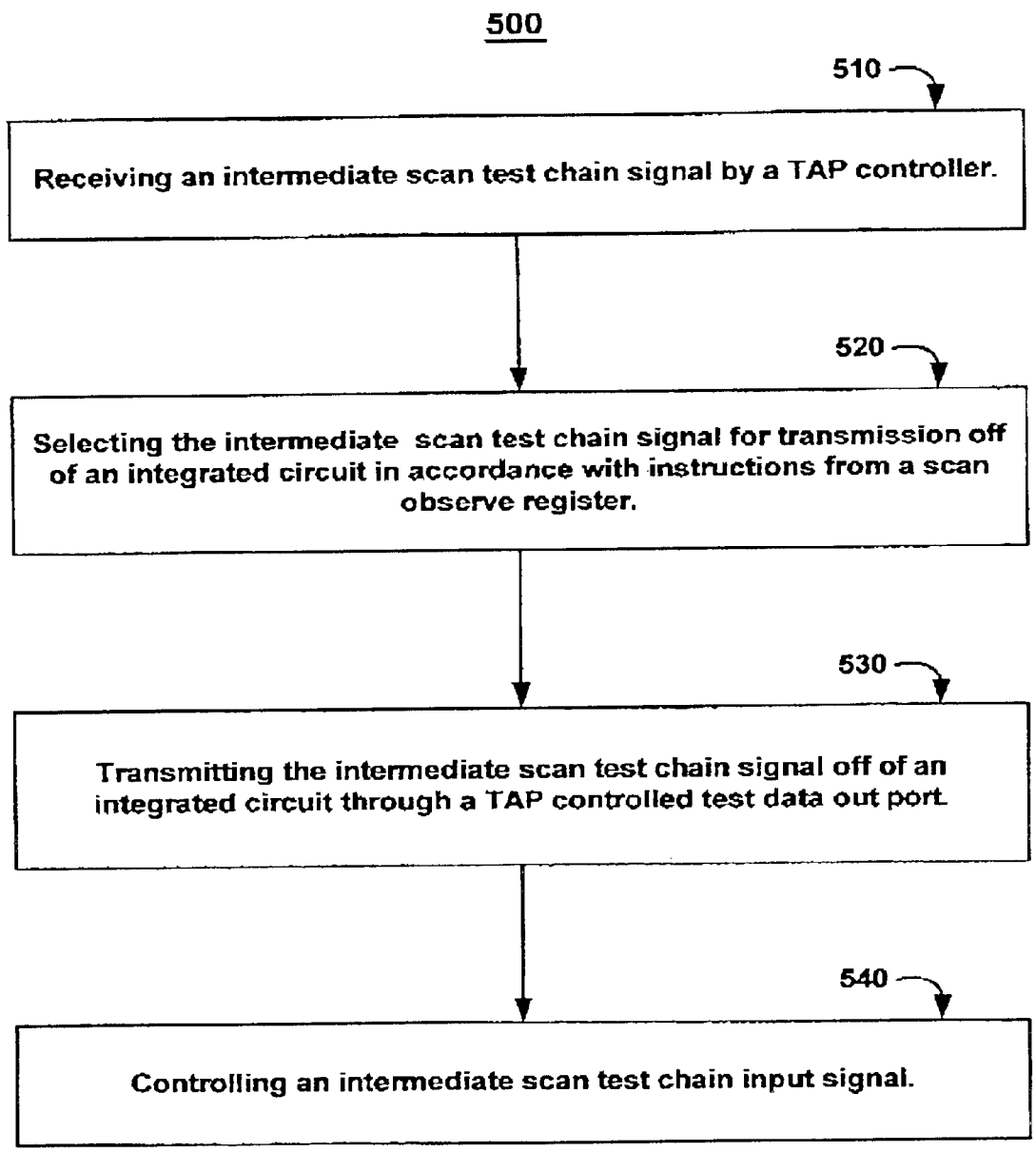
FIG. 5 is a flow chart of TAP controlled internal scan test debugging method, one embodiment of the present invention.

FIG. 5 is a flow chart of TAP controlled internal scan test intermediate debugging method 500, one embodiment of the present invention. TAP controlled internal scan test intermediate debugging method 500 facilitates debugging of scan test fault indications within an IC. In one embodiment of the present invention, TAP controlled internal scan test intermediate debugging method 500 is utilized to enhance scan test granularity and simplify analysis of scan test results.

In step 510, intermediate scan test signals are received by a TAP controller from a scan test chain. In one embodiment of TAP controlled internal scan test intermediate debugging method 500, an intermediate scan test signal is received during a capture mode of a scan test operation and is accomplished by deasserting a scan test enable signal and asserting a clock pulse. In one embodiment of the present invention, the intermediate scan test signal is a signal received from an output of an internal functional logic component (e.g., a design circuit block) included in an IC.

In step 520, an intermediate scan test chain signal is selected for transmission off of the IC. In one exemplary implementation of the present invention, a TAP controller controls the selection of intermediate scan test chain information for transmission off of the IC. In one embodiment of the present invention, a switching circuit (e.g., a multiplexer) is manipulated to select an intermediate scan test signal for transmission off of the IC. For example, a multiplexer is utilized to provide a communication path from one of its inputs receiving an intermediate scan test signal to an output of multiplexer coupled to a TDO port associated with a TAP controller. The multiplexer selects an input to couple to its output based upon control values sent to the multiplexer from an output control register in accordance with instructions from a scan observe register. Control values that determine the selection of an intermediate scan test signal are cycled in one embodiment of the present application to sequentially obtain information associated with each intermediate scan test signal.

The intermediate scan test information is transmitted off of an IC through a test data out (TDO) port in step 530. In one example of the present invention, the intermediate scan test information is utilized to facilitate debugging of scan test fault indications. In one embodiment of the present invention, intermediate scan test information is retrieved from the inputs and outputs of internal functional logic blocks (e.g., a design circuit block) and provides an indication if the functional logic block is faulty. For example, if a test vector value input to an internal functional logic block is confirmed (e.g., by transmitting an intermediate scan test chain signal at the input of the internal functional logic block off the IC) and an intermediate scan test signal value is retrieved from the output of the functional logic block does not match an expected value for a properly functioning logic circuit, there is an indication that the functional logic block is not operating properly and has a fault.

In step 540, an intermediate scan test chain input signal is controlled. In one exemplary embodiment of TAP controlled internal scan test debugging method 500, a functional logic component performs designated operations based upon scan test input information shifted in on the scan test chain and presented to inputs of the functional component (e.g., a design circuit block). In one embodiment of the present invention, an intermediate scan test chain input signal is supplied to a downstream scan test element (e.g., a scan test element of design circuit block 432) from a test data in (TDI) port without going through an upstream scan test element (e.g., a scan test element of design circuit block 431). An intermediate scan test chain input signal is switched between a signal from an upstream scan test element and a TDI signal that has not flowed through an upstream scan test element. In one exemplary implementation the TDI signal is communicated from a TDI port associated with a TAP controller.

Thus, the present invention is a system and method that facilitates desirable scan testing of internal components with minimal impacts to normal operations and manufacturing processes. The system and method of the present invention supports efficient scan testing of integrated circuit components with an ATPG tool while providing effective measurement of intermediate scan test values. Controlling the intermediate scan test chain input signals and selecting an intermediate internal scan test chain signal for transmission of off an IC facilitates isolation and analysis of a potential scan test fault while still permitting a scan test result for the entire chain via a scan test chain final output pin (not shown). The present invention utilizes control features of an intermediate TAP controlled internal scan system and method to perform normal scan test operations (e.g., IEEE 1394 compliant boundary scan tests) and internal intermediate scan test operations without requiring additional dedicated intermediate scan test pins. A scan test chain intermediate debugging system and method of the present invention accommodates utilization of existing testing scan architectures and minimization of adverse redesign impacts to existing IC designs.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An intermediate test access port (TAP) controller internal scan test system comprising:
   a TAP output multiplexer (MUX) adapted to output one of its input signals as a test data out (TDO) signal;
   a TAP output control circuit coupled to said TAP output multiplexer, said output control circuit adapted to provide a control signal that controls the output of said TAP output multiplexer; and
   an internal scan observe register coupled to said TAP output control circuit, said internal scan observe register adapted to provide internal scan test directions to said output control circuit when said TAP controller internal scan test system is operating in internal scan test mode.

2. The intermediate test access port (TAP) controller internal scan test system of claim 1 wherein an input of said TAP output multiplexer includes an intermediate internal scan test chain signal (ISS).

3. The intermediate test access port (TAP) controller internal scan test system of claim 1 wherein said internal scan observe register is coupled to an intermediate input control signal.

4. The intermediate test access port (TAP) controller internal scan test system of claim 1 further comprising an intermediate input control register adapted to transmit an intermediate input control signal.

5. The intermediate test access port (TAP) controller internal scan test system of claim 1 wherein said internal scan observe register is adapted to accommodate an internal scan test mode indication instruction that determines whether said TAP output MUX is utilized to forward internal scan test signals or said TAP output MUX is utilized to forward boundary scan test signals.

6. The intermediate test access port (TAP) controller internal scan test system of claim 1 wherein said TAP output MUX selectively transmits one of a plurality of intermediate internal scan test chain signals off of an integrated circuit.

7. An intermediate test access port (TAP) controller internal scan test system further comprising:
   a TAP output multiplexer (MUX) adapted to output one of its input signals as a test data out (TDO) signal;
   a TAP output control circuit coupled to said TAP output multiplexer, said output control circuit adapted to provide a control signal that controls the output of said TAP output multiplexer;
   an internal scan observe register coupled to said TAP output control circuit, said internal scan observe register adapted to provide internal scan test directions to said output control circuit when said TAP controller internal scan test system is operating in internal scan test mode;
   a TAP state machine coupled to said internal scan observe register, said TAP state machine adapted to control the state of said test access port (TAP) controller system;
   a bypass register coupled to said TAP state machine, said bypass register adapted to provide a bypass path between a test data in port and a test data out port;
   an IDcode register coupled to said TAP state machine, said IDcode register adapted to store information associated with identifying an integrated circuit;

an instruction holding register coupled to said TAP state machine, said instruction holding register adapted to store an instruction; and an instruction shift register coupled to said TAP state machine, said instruction shift register adapted to shift said instruction.

8. A test access port (TAP) controlled internal scan test intermediate debugging system comprising:

an intermediate TAP controller internal scan test system adapted to transmit an indicated intermediate scan test chain signal off of an integrated circuit as a test data out signal, said intermediate TAP controller internal scan test system includes an internal scan observe register, said internal scan observe register controls the selection of an intermediate internal scan test input signal;

a plurality of design circuit blocks coupled to said intermediate TAP controller internal scan test system, said plurality of design circuit blocks adapted to perform designated functions during normal operation mode and include scan test elements adapted to shift in scan test vectors, capture resulting scan test information and shift out the scan test results during scan test operations;

a scan test chain primary input pin coupled to one of said plurality of design circuit blocks, said scan test chain primary input pin adapted to provide a communication port for scan test input information; and a scan test chain final output pin coupled to one of said plurality of design circuit blocks, said scan test chain final output pin adapted to provide a communication port for scan test output information.

9. A test access port (TAP) controlled internal scan test intermediate debugging system of claim 8 wherein said intermediate TAP controller internal scan test system is adapted to control transmission of said indicated intermediate scan test chain signal off of said integrated circuit as said test data out signal.

10. A test access port (TAP) controlled internal scan test intermediate debugging system of claim 8 wherein said intermediate TAP controller internal scan test system includes an intermediate input control register, said intermediate input control register controls the selection of an intermediate internal scan test input signal.

11. A test access port (TAP) controlled internal scan test intermediate debugging system of claim 8 further comprising an intermediate internal scan test input signal multiplexer coupled to said TAP controller internal scan test system, said intermediate internal scan test input signal multiplexer adapted to selectively forward a test data in (TDI) signal or an internal scan test signal based upon an intermediate input control signal from said TAP controller internal scan test system.

12. A TAP controlled internal scan test intermediate debugging method comprising the steps of:

receiving an intermediate scan test chain signal by a TAP controller from a scan test chain;

selecting said intermediate scan test chain signal for transmission off of an integrated circuit in accordance with instructions from a scan observe register; and transmitting said intermediate scan test chain signal off of an integrated circuit through a TAP controlled test data out (TDO) port.

13. A TAP controlled internal scan test intermediate debugging method of claim 12 further comprising the step of controlling an intermediate scan test chain input signal.

14. A TAP controlled internal scan test intermediate debugging method of claim 12 wherein said intermediate scan test chain signal is received during a capture mode of a scan test system from an output of a functional logic component included in an integrated circuit.

15. A TAP controlled internal scan test intermediate debugging method of claim 12 further comprising the step of manipulating a switching circuit to communicate said intermediate scan test signal off of the IC.

16. A TAP controlled internal scan test intermediate debugging method of claim 12 further comprising the step of utilizing a multiplexer to provide a communication path from an input of said multiplexer to an output of said multiplexer based upon control values sent to said multiplexer from an output control register in accordance with instructions from a scan observe register.

17. A TAP controlled internal scan test intermediate debugging method of claim 12 further comprising the step of utilizing information conveyed via said intermediate scan test signal to facilitate debugging of scan test fault indications.

18. A TAP controlled internal scan test intermediate debugging method of claim 12 further comprising the step of retrieving said intermediate scan test signal from the inputs and outputs of functional logic blocks.

19. A TAP controlled internal scan test intermediate debugging method of claim 12 further comprising the step of supplying an intermediate scan test chain input signal to a downstream scan test element from a test data in (TDI) pin without going through an upstream scan test element.

20. A TAP controlled internal scan test intermediate debugging method of claim 12 further comprising the step of switching an intermediate scan test chain input signal between a signal from an upstream scan test element and a TDI signal that has not flowed through an upstream scan test element.

* * * * *